(12) United States Patent
Lazaar

(10) Patent No.: US 6,297,294 B1
(45) Date of Patent: Oct. 2, 2001

(54) METHOD FOR IMPROVING THE ADHESION OF A PHOTOPOLYMERIZABLE COMPOSITION TO COPPER

(75) Inventor: Kenneth Isaac Lazaar, Sayre, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/413,930

(22) Filed: Oct. 7, 1999

(51) Int. Cl.⁷ ........................................... C08F 2/48
(52) U.S. Cl. ..................... 522/79; 522/74; 522/71; 522/84; 522/182; 522/120; 522/121; 522/178; 427/516; 427/517; 430/270.1; 430/270.11; 430/273; 430/323; 156/272.2; 156/275.5; 156/327; 428/411.1; 428/500
(58) Field of Search ................ 430/56, 260, 258, 430/322, 323, 324, 281.1, 286.1, 271.1, 275.1, 277.1, 270.1, 270.11, 273; 156/272.2, 275.5, 325, 326, 327, 332

(56) References Cited

U.S. PATENT DOCUMENTS

| | | | |
|---|---|---|---|
| 3,622,334 | 11/1971 | Hurley et al. ........................... | 96/83 |
| 4,510,230 * | 4/1985 | Coveleskie et al. .................. | 430/273 |
| 4,565,771 * | 1/1986 | Lynch et al. .......................... | 430/307 |
| 4,668,604 * | 5/1987 | Cohen et al. .......................... | 430/258 |
| 4,680,249 | 7/1987 | Weed ................................... | 430/281 |
| 4,693,959 * | 9/1987 | Ashcrft ................................. | 430/323 |
| 4,710,262 * | 12/1987 | Weed ................................... | 156/630 |
| 4,741,987 | 5/1988 | Tohda et al. .......................... | 430/288 |
| 5,079,129 * | 1/1992 | Roth et al. ............................ | 430/280 |
| 5,124,233 * | 6/1992 | Meier et al. ........................... | 430/280 |
| 5,374,500 * | 12/1994 | Carpenter, Jr. et al. ............. | 430/270 |
| 5,886,101 * | 3/1999 | Sommerfeld et al. ............... | 525/112 |
| 6,096,816 * | 8/2000 | Kuckro ................................. | 524/405 |

OTHER PUBLICATIONS

Peter McGrath, Multilayer PCB Manufacture: Using a permanent photoresist—it can by done. Printed Circuit Fabrication. vol. 21, No. 2, Feb. 1998.*

* cited by examiner

Primary Examiner—James J. Seidleck
Assistant Examiner—Sanza McClendon

(57) ABSTRACT

A method of increasing the adhesion of a photopolymerizable composition and the photopolymerized composition formed therefrom, which method comprises the step of adding an adhesion promoter, which consists essentially of a polycarboxylic acid having three to six carbon atoms, to the photopolymerizable composition.

7 Claims, No Drawings

METHOD FOR IMPROVING THE ADHESION OF A PHOTOPOLYMERIZABLE COMPOSITION TO COPPER

BACKGROUND OF THE INVENTION

1. Field of the Invention

This invention relates to a method for improving the adhesion of a photopolymerizable composition and the photopolymerized composition formed therefrom to copper. The photopolymerizable composition is useful as a dry film photoresist.

2. Description of the Related Art

Photosensitive compositions particularly useful as photoresists are well known in the prior art. The compositions can be positive-working or negative-working. Particularly useful are negative-working compositions, also known as photopolymerizable systems. The photopolymerizable composition generally contains a polymeric binder, at least one monomeric or oligomeric material capable of polymerizing and/or cross-linking, and a photoinitiator or photoinitiator system. Exposure to actinic radiation initiates the polymerization and/or crosslinking reactions, resulting in insolubilization of the material in developer solvents. The thus formed latent image can then be developed by treating with developer solvent. The photopolymerizable compositions are generally formed as a dry film on a support. The dry film is sandwiched between the support film and a coversheet and stored in roll form.

The photosensitive film is conventionally unwound from a roll and, after the coversheet is removed, laminated to a substrate. The laminated composition is exposed imagewise to actinic radiation, with the support film stripped from the photosensitive composition before or after the exposure step. The exposed film is then treated with developer solvent which removes the unexposed areas of the photosensitive composition to form a resist image of polymeric material. The thus uncovered portion of the substrate can be treated as desired, followed by removal of the polymeric resist image.

For the high resolution desired in the electronics industry today, it is necessary for the resist to be removed cleanly in the development step without leaving any residue on the substrate. The addition of low molecular weight acids to reduce scum and stain formation in aqueous processable photopolymerizable compositions has been disclosed in Covesleskie et al., U.S. Pat. No. 4,510,230. However, in addition to low residue and scum formation, it is also important that the photoresist have good adhesion to the substrate, usually copper. The board with imaged resist is treated with a variety of chemicals during the manufacturing steps, typically etching and/or plating chemistries. Inadequate adhesion of the photoresist to the substrate can result in the chemistries reacting underneath the resist in areas intended to be covered. Thus the quality of the end product is reduced and failures can occur. Photopolymerizable compositions containing benzotriazoles and benzotriazole carboxylic acids have been shown to improve the adhesion of the compositions to substrates in, for example, Hurley et al., U.S. Pat. No. 3,622,334; Weed, U.S. Pat. No. 4,680,249; and Tohda et al, U.S. Pat. No. 4,741,987.

SUMMARY OF THE INVENTION

This invention is directed to a method for increasing the adhesion of a photopolymerizable composition and the photopolymerized composition formed therefrom to a copper substrate, said substrate presenting at least one surface, said photopolymerizable composition being adapted for application to said at least one surface for photopolymerizing thereon and comprising (a) a photoinitiator system; (b) a nongaseous, ethylenically unsaturated monomer or oligomer; and (c) a preformed macromolecular binder, said method comprising the step of adding to said photopolymerizable composition 0.01 to 1.0 percent, by weight, of an adhesion promoter, based upon the total weight of the photopolymerizable composition;

said adhesion promoter consisting essentially of a polycarboxylic acid having 3–6 carbon atoms.

The method results in improved adhesion between copper substrates and photopolymerizable and photopolymerized compositions when the compositions are laminated onto the substrate. The photopolymerizable composition is generally present as a layer between a film support and a coversheet.

DESCRIPTION OF THE PREFERRED EMBODIMENTS

Photosensitive compositions used in conjunction with the method of the present invention are particularly suitable for use as photoresists in the formation of printed circuit boards. The compositions have improved adhesion to copper. Other compounds are known to improve adhesion to copper. Examples include benzotriazole and substituted benzotriazoles such as hydroxybenzotriazole, carboxybenzotriazole, etc. The adhesion promoter of the current invention is useful alone or in combination with other adhesion promoters.

In the method of the invention, the adhesion to copper is improved by the addition of an adhesion promotor to the photopolymerizable compositions. The adhesion promoter is an aliphatic poly-carboxylic acid, by which is meant an organic compound having more than one carboxylic acid group. The polycarboxylic acid contains from 3–6 carbon atoms. Examples of suitable acids include malonic acid, and adipic acid. Combinations of acids can be used. A preferred polycarboxylic acid adhesion promotor is succinic acid. The adhesion promoter is present at a level which is effective to improve the adhesion of the composition to copper without adversely affecting the other necessary properties of the photosensitive composition. It is preferred to use the lowest amount possible so as to minimize the amount of added electrolyte to the composition. Generally, the adhesion promoter will be present in an amount of about 0.01 to 1% by weight of the total photosensitive composition; preferably 0.02 to 0.4% by weight.

The photosensitive composition further comprises a photoinitator system, a non-gaseous ethylenically unsaturated monomer or oligomer, and a preformed macromolecular binder.

The photoinitiator system has one or more compounds that directly furnish free radicals when activated by actinic radiation. The system also may contain a sensitizer that is activated by the actinic radiation, causing the compound to furnish the free radicals. Useful photoinitiator systems typically will contain a sensitizer that extends spectral response into the near ultraviolet, visible, and near infrared spectral regions.

Photoinitiator systems are well known and discussions of such systems can be found in, for example, "Photoreactive Polymers: The Science and Technology of Resists" by A. Reiser, John Wiley & Sons, New York, 1989, and "Radiation Curing: Science and Technology" edited by S. P. Pappas, Plenum Press, New York, 1992.

Preferred photoinitiator systems are free radical generating addition polymerization initators activatable by actinic light and thermally inactive at and below 185° C. These include the substituted or unsubstituted polynuclear quinones such as 9,10-anthroquinone; vicinal ketaldonyl alcohols, such as benzoin; α-hydrocarbon-substituted aromatic acyloins, including α-methylbenzoin; Michler's ketone, benzophenone, 2,4,5-triphenyl-imidazolyl dimers with hydrogen donors. Particularly preferred photoinitiators include hexaarylbiimidazoles in association with a hydrogen donor; Michler's ketone and ethyl Michler's ketone, particularly in association with benzophenone; and acetophenone derivatives.

The ethylenically-unsaturated compound is one which is capable of undergoing free-radical initiated polymerization and/or crosslinking. Such compounds are generally known as monomers or oligomers, although polymers having reactive pendant groups can also be used. Such compounds are well known in the art and have been disclosed in, for example, "Light-Sensitive Systems: Chemistry and Application of Nonsilver Halide Photographic Processes" by J. Kosar (John Wiley & Sons, Inc., 1965); "Imaging Processes and Materials—Neblette's Eight Edition" edited by J. Sturge, V. Walworth and A. Shepp (Van Nostrand Reinhold, 1989); and "Photoreactive Polymer—The Science and Technology of Resists" by A. Reiser (John Wiley & Sons, 1989). Typical monomers are: unsaturated esters of alcohols, preferably ester of polyols with acrylic or methacrylic acid, such as t-butyl acrylate, cyclohexyl acrylate, hydroxy-C1–C10-alkyl acrylate, butanediol diacrylate, hexamethylene glycol diacrylate, trimethylolpropane triacrylate, polyoxyethylated trimethylopropane triacrylate, diethylene glycol diacrylate, glycerol triacrylate, ethylene glycol dimethacrylate, pentaaerythritol tri-and tetraacrylate and methacrylate; acryloxy-and methacryloxy-alkyl ethers of bisphenol A, such as di-(3-acryloxy-2-hydroxypropyl) ether of bisphenol A and di-(3-acryloxy-2-hydroxypropyl) ether of tetrabromo-bisphenol A; unsaturated amides, such as 1,6-hexamethylene bis-acrylamide; vinyl esters, such as divinyl succinate, divinyl phthalate, and divinyl benzene-1,3-disulfonate; styrene and derivatives thereof; and N-vinyl compounds, such as N-vinyl carbazole.

The binder is a film forming material which may contain reactive groups. Suitable binders that can be used alone or in combination are well known in the art. These include polyacrylate and alpha-alkyl acrylate esters; polyvinyl esters; ethylene vinyl acetate copolymers; polystyrene polymers and copolymers; vinylidene chloride copolymers; polyvinyl chloride and copolymers; synthetic rubbers; high molecular weight polyethylene oxides of polyglycols; epoxides; copolyesters; polyamides; polycarbonates; polyvinyl acetals; polyformaldehydes. Recently there has been more and more interest in binders which are aqueous processable. For aqueous processability, the binders should be developable by aqueous alkaline solution. By "developable" is meant that the binders are soluble, swellable or dispersible in the developer solution. Preferably, the binder is soluble in the developer solution. Particularly preferred as binders are acidic, polymeric, organic compounds. Single or multiple binder compounds can be used. One class of binders which is useful in the process of the invention is vinyl addition polymers containing free carboxylic acid groups. These are prepared from 30–94 mole percent of one or more alkyl acrylates and 70–6 mole percent of one or more alpha-beta ethylenically unsaturated carboxylic acids; more preferably from 61–94 mole percent of two alkyl acrylates and 39–6 mole percent of an alpha-beta ethylenically unsaturated carboxylic acid. Suitable alkyl acrylates for use in preparing these polymeric binders include methyl acrylate, ethyl acrylate, propyl acrylate, butyl acrylate, and the methacrylate analogs. Suitable alpha-beta ethylenically unsaturated carboxylic acids include acrylic acid, methacrylic acid, crotonic acid, maleic acid or maleic anhydride, and the like. Binders of this type, including their preparation, are described in German Application, OS 2,320,849, published Nov. 8, 1973. Also suitable are copolymers of styrene and substituted styrenes with an unsaturated carboxyl-containing monomer, as described in detail in British Patent 1,361,298.

Other components conventionally added to photopolymerizable compositions can be present to modify the physical properties of the layer. Such components include: plasticizers, thermal stabilizers, optical brighteners, ultraviolet radiation absorbing material, color formers, additional adhesion modifiers, coating aids, and release agents. In addition, depending on the application, other inert additives can be employed such as dyes, pigments and fillers. These additives are generally present in minor amounts so as not to interfere with the exposure of the photoresist.

Typical compositions for the photopolymerizable layer are, by weight: photoinitiator system, 0.1 to 10%, preferably 1 to 5%; ethylenically unsaturated compound(s), 5 to 60%, preferably 15 to 50%; binder(s), 25 to 90%, preferably 45 to 75%; adhesion promoters, 0.01 to 1.0%, preferably 0.1 to 0.4%; all other components, 0 to 5%, preferably 0 to 4%. The thickness of the layer varies according to the end use. Generally, the thickness is in the range of 0.5–5 mils (13–127 microns).

The photosensitive compositions of this invention are particularly useful as photoresists for preparing printed circuit boards. Typically, the components of the photosensitive composition are mixed together in a suitable solvent, aqueous-based or non-aqueous. The solution is coated onto a base support and dried to form a photosensitive film. The base support for the element can be any dimensionally stable film. Such support films are well known in the art and include polyesters, polyamides, polyolefins, polyimides, vinyl polymers, cellulose esters, and other relatively high molecular weight polymeric materials. A preferred base support for the present invention is polyethylene terephthalate. It is also possible to have a release coating on the backside of the support, that is the side which does not have the photosensitive layer. When the element is wound into a roll, the release coating helps to prevent the element of one layer from sticking to the backside of the adjacent layer. This facilitates the unwinding of the roll when the element is readied for use. Release materials are well-known in the art and include polysilicones, vinyl alcohol polymers, substituted polyacrylamides, fluorocarbons, and selected surfactants. The thickness of the film is generally in the range of 1 to 150 micrometers. For storage, a coversheet is generally present over the photosensitive layer.

In using the photosensitive film, it is generally laminated to a substrate, after removal of the coversheet, when present. A wide variety of substrates can be used. By "substrate" is meant any natural or synthetic support, preferably one which is capable of existing in a flexible or rigid form. For printed circuit board applications, the substrate may be a copper coated fiberglass epoxy board, copper clad film, or printed circuit relief pattern on the board or film. The photosensitive film is generally laminated to the substrate using heat and/or pressure, e.g., with a conventional hot-roll laminator. The temperature of lamination for such films is typically in the range of 50–120° C.

The applied photosensitive layer is then imagewise exposed to actinic radiation to harden or insolubilize the exposed areas. Any convenient source of actinic radiation providing wavelengths in the region of the spectrum that overlap the absorption bands of the photoinitiator system can be used to activate the photoreactions. The unexposed areas are then completely removed, typically with a developer solution which selectively dissolves, strips or otherwise disperses the unexposed areas without adversely affecting the integrity or adhesion of the exposed areas. The uncovered areas of the substrate are then subjected to further processing, such as etching and/or plating steps.

While the photosensitive compositions of the invention have improved adhesion to copper, it is important that the other properties of the photoresist not be adversely affected. Thus the compositions should have: good differentiation between exposed and unexposed areas such that the unexposed areas can be removed cleanly and quickly; good resolution; adequate solvent resistance, toughness, plating performance, etchant resistance, and flexibility.

As was discussed above, it is important for the film to have good adhesion to the copper on the substrate in order to remain attached during further processing steps. Good adhesion is necessary both before and after exposure to actinic radiation. Prior to exposure, the film may be cut or trimmed, and inadequate adhesion can result in lifting of the edges which can cause defects in the final imaged photoresist pattern. After exposure, the photoresist must have good adhesion in order to protect the underlying areas during further processing. In general, the adhesion of the unexposed photopolymerizable layer immediately after lamination to the copper substrate, also known as "instant adhesion", is indicative of the adhesion of the photoresist throughout the imaging and processing steps. The adhesion of the photopolymerizable composition to copper generally increases with time after lamination. However, since many trimming operations occur in-line immediately after lamination, it is important that the adhesion of the photopolymerizable composition to copper be adequate immediately, i.e, within 5 minutes after lamination.

A measure of instant adhesion, is the ability of the photopolymerizable layer to resist delamination, as determined by the test in ASTM D 3359-78, Standard Method B. In this test, the amount of photopolymerizable layer removable by masking tape is measured. It is preferred that no more than 50% of the photopolymerizable layer be removed in the test at 5 minutes after lamination; more preferred that no more than 25% be removed.

EXAMPLES

The invention is illustrated by the following examples which are not intended to be limiting. All percentages are by weight, unless otherwise indicated.

Glossary

| Abbreviation | Chemical Name |
|---|---|
| Binder A | methymethacrylate-32/butylmethacrylate-15/butyl-acrylate-15/Styrene-15/methacrylic acid-23 MW = 85,000 |
| Binder B | poly(oxyethylene/oxypropylene) copolymer |
| BP | benzophenone |
| 4/5 BCTA | mixture of 4-benzotriazole carboxylic acid and 5-benzotriazole carboxylic acid |
| ClBZT | 5-chlorobenzotriazole |
| DABP | 4,4'-bis(diethylamino)benzophenone |
| DBC | 2,3-dibromo-3-phenylpropiophenone |

-continued

Glossary

| Abbreviation | Chemical Name |
|---|---|
| DBHA | N,N-diethylhydroxylamine |
| BMK | ethyl Michler's ketone |
| ITX | isopropylthioxanthone |
| LCV | leuco crystal violet |
| MPEP | 2,2-Bis[4-(Methacryloxy polyethoxy) phenyl]propane (30 EO) |
| ODAB | 2-ethylhexyl-p-dimethyiaminobenzoate |
| TAOBN | 2,3-Diazabicyclo[3,2,2]non-2-ene, 1,4,4-trimethyl-N,N'-dioxide |
| TMCH | 4-methyl-4-trichloromethylcyclohexadienone |
| TMPEOTA | ethoxylated trimethylolpropane triacrylate |
| TRPGDA | tripropyleneglycol diacrylate |

All films were prepared by dissolving the components in the solvent indicated and coating onto the support film indicated. The coatings were air dried at room temperature.

Instant Adhesion Test

The instant adhesion criterion (also designated "IA") is the ability of a photoresist film to resist delamination, e.g., when the film support is removed or the panel is trimmed, immediately after lamination and before imaging exposure. Instant adhesion vs time after lamination (up to 24 hours) was measured using a cross-cut tape test based on ASTM D 3359-78, Standard Method B. In the test, the photoresist was laminated to a substrate and the support film removed. A perpendicular lattice pattern with either six or eleven cuts in each direction separated by a spacing of one or two mm was made on the resist layer. A uniform length of a 1 inch (25.4 mm) wide tape (226 Masking Tape from 3M, St. Paul, Minn.) was applied to the lattice area using finger pressure. Within 30 seconds, the tape was peeled back at a constant angle between 90° and 180° in one quick motion. The degree of instant adhesion, IA, was rated according to the percent of resist removed with the tape, using the following scale:

5—No resist removed.
4—Up to 25% resist removed.
3—26% to 50% resist removed.
2—51% to 75% resist removed.
1—76% to 100% resist removed.

Example 1

This example illustrates the improved adhesion to copper of the photosensitive compositions of the invention including an additional adhesion promotor, a benzotriazole acid mixture.

Photosensitive coating compositions were prepared in a solvent of acetone and methanol, having the following compositions, with components in parts by weight.

| Component | control | 1-A | 1-B | 1-C |
|---|---|---|---|---|
| Succinic Acid | 0.0 | 0.05 | 0.1 | 0.2 |
| Polymer binder A | 59.0 | 59.0 | 59.0 | 59.0 |
| Polymer binder B | 9.28 | 9.28 | 9.28 | 9.28 |
| TMPEOTA | 2.762 | 2.762 | 2.762 | 2.762 |
| TRPGDA | 23.0 | 23.0 | 23.0 | 23.0 |
| ODAB | 1.892 | 1.892 | 1.892 | 1.892 |
| ITX | 0.237 | 0.237 | 0.237 | 0.237 |
| BP | 2.837 | 2.837 | 2.837 | 2.837 |
| TMCH | 0.237 | 0.237 | 0.237 | 0.237 |

-continued

| Component | control | 1-A | 1-B | 1-C |
|---|---|---|---|---|
| DBC | 0.095 | 0.095 | 0.095 | 0.095 |
| LCV | 0.378 | 0.378 | 0.378 | 0.378 |
| DABP | 0.142 | 0.142 | 0.142 | 0.142 |
| ClBZT | 0.05 | 0.05 | 0.05 | 0.05 |
| 4/5 BCTA | 0.03 | 0.03 | 0.03 | 0.03 |
| Victoria Blue Dye | 0.03 | 0.03 | 0.03 | 0.03 |
| TAOBN | 0.06 | 0.06 | 0.06 | 0.06 |
| Acetone | 190.0 | 190.0 | 190.0 | 190.0 |
| Methanol | 10.0 | 10.0 | 10.0 | 10.0 |

Films of approximately 1.4 mil (35.6 micron) thickness were produced after coating on a polyethyleneterephthalate film support and room temperature drying to remove acetone and methanol.

Film samples were conventionally laminated to the surface of a copper clad printed circuit board epoxy substrate. The compositions were tested for the photoresist property of instant adhesion at different times after lamination with the results given below.

TABLE 1

Instant Adhesion vs Time After Lamination

| Sample | 5 minutes | 1 hour | 2 hours | 4 hours | 24 hours |
|---|---|---|---|---|---|
| control | 1 | 1 | 3 | 4 | 4 |
| 1-A | 3 | 4 | 4 | 4 | 4 |
| 1-B | 4 | 5 | 4 | 5 | 5 |
| 1-C | 4 | 4 | 4 | 5 | 5 |

The results indicate improvement in instant adhesion to copper for coatings that include succinic acid.

Example 2

This example illustrates the improved adhesion to copper of the photosensitive compositions of the invention in the absence of any additional adhesion promoter.

Photosensitive coating compositions were prepared in a solvent of acetone and methanol, having the following compositions, with components in parts by weight.

| Component | control | 2-A | 2-B | 2-C |
|---|---|---|---|---|
| Succinic Acid | 0.0 | 0.05 | 0.1 | 0.2 |
| Polymer binder A | 59.0 | 59.0 | 59.0 | 59.0 |
| Polymer binder B | 9.28 | 9.28 | 9.28 | 9.28 |
| TMPEOTA | 2.762 | 2.762 | 2.762 | 2.762 |
| TRPGDA | 23.0 | 23.0 | 23.0 | 23.0 |
| ODAB | 1.892 | 1.892 | 1.892 | 1.892 |
| ITX | 0.237 | 0.237 | 0.237 | 0.237 |
| BP | 2.837 | 2.837 | 2.837 | 2.837 |
| TMCH | 0.237 | 0.237 | 0.237 | 0.237 |
| DBC | 0.095 | 0.095 | 0.095 | 0.095 |
| LCV | 0.378 | 0.378 | 0.378 | 0.378 |
| DABP | 0.142 | 0.142 | 0.142 | 0.142 |
| ClBZT | 0.05 | 0.05 | 0.05 | 0.05 |
| Victoria Blue Dye | 0.03 | 0.03 | 0.03 | 0.03 |
| TAOBN | 0.06 | 0.06 | 0.06 | 0.06 |
| Acetone | 190.0 | 190.0 | 190.0 | 190.0 |
| Methanol | 10.0 | 10.0 | 10.0 | 10.0 |

The coatings were evaluated for instant adhesion, as described above. The results are given in Table 2.

TABLE 2

Instant Adhesion vs Time After Lamination

| Sample | 5 minutes | 1 hour | 2 hours | 4 hours | 24 hours |
|---|---|---|---|---|---|
| control | 1 | 1 | 1 | 1 | 1 |
| 2-A | 1 | 1 | 1 | 2 | 4 |
| 2-B | 4 | 5 | 4 | 5 | 5 |
| 2-C | 5 | 5 | 4 | 5 | 5 |

The results indicate that the instant adhesion to copper is improved with photosensitive compositions containing succinic acid. It also indicates that the adhesion improves with time.

Example 3

This example illustrates the improved adhesion to copper of the photosensitive compositions of the invention as compared to compositions containing other polycarboxylic acids as additives.

Photosensitive coating compositions were prepared in a solvent of acetone and methanol, having the following compositions, with components in parts by weight.

| COMPONENT | control | Ex. 3 | Comp. A | Comp. B | Comp. C |
|---|---|---|---|---|---|
| Succinic Acid | 0.0 | 0.1 | 0.0 | 0.0 | 0.0 |
| Sebacic Acid | 0.0 | 0.0 | 0.1 | 0.0 | 0.0 |
| Suberic Acid | 0.0 | 0.0 | 0.0 | 0.1 | 0.5 |
| Polymer binder A | 63.0 | 63.0 | 63.0 | 63.0 | 63.0 |
| Polymer binder B | 5.23 | 5.23 | 5.23 | 5.23 | 5.23 |
| TMPEOTA | 2.8 | 2.8 | 2.8 | 2.8 | 2.8 |
| TRPGDA | 20.0 | 20.0 | 20.0 | 20.0 | 20.0 |
| MPEP | 3.0 | 3.0 | 3.0 | 3.0 | 3.0 |
| ODAB | 1.9 | 1.9 | 1.9 | 1.9 | 1.9 |
| ITX | 0.25 | 0.25 | 0.25 | 0.25 | 0.25 |
| BP | 2.8 | 2.8 | 2.8 | 2.8 | 2.8 |
| TMCH | 0.25 | 0.25 | 0.25 | 0.25 | 0.25 |
| DBC | 0.1 | 0.1 | 0.1 | 0.1 | 0.1 |
| LCV | 0.38 | 0.38 | 0.38 | 0.38 | 0.38 |
| DABP | 0.14 | 0.14 | 0.14 | 0.14 | 0.14 |
| ClBZT | 0.05 | 0.05 | 0.05 | 0.05 | 0.05 |
| 4/5 CBZT | 0.03 | 0.03 | 0.03 | 0.03 | 0.03 |
| Victoria Blue Dye | 0.03 | 0.03 | 0.03 | 0.03 | 0.03 |
| TAOBN | 0.06 | 0.06 | 0.06 | 0.06 | 0.06 |
| Acetone | 190.0 | 190.0 | 190.0 | 190.0 | 190.0 |
| Methanol | 10.0 | 10.0 | 10.0 | 10.0 | 10.0 |

The coatings were evaluated for instant adhesion, as described in Example 1 above. The results are given in Table 3.

TABLE 3

Instant Adhesion

| Coating | 5 minutes |
|---|---|
| Control | 1 |
| Example 3 | 4 |
| Comparative A | 2 |
| Comparative B | 2 |
| Comparative C | 4 |

The results show that the composition of the invention containing succinic acid as the adhesion promotor, has improved adhesion at a much lower level. Only when suberic acid was present at a level 5 times greater than that of succinic acid was an improvement in adhesion seen 5 minutes after lamination.

What is claimed is:

1. A method for increasing the adhesion of a photopolymerizable composition and the photopolymerized composition formed therefrom to a copper substrate, said substrate presenting at least one surface, said photopolymerizable composition being adapted for application to said at least one surface for photopolymerizing thereon and comprising (a) a photoinitiator system; (b) a nongaseous, ethylenically unsaturated monomer or oligomer; and (c) a preformed macromolecular binder, said method comprising the step of adding to said photopolymerizable composition 0.01 to 1.0 percent, by weight, of an adhesion promoter, based upon the total weight of the photopolymerizable composition;

said adhesion promoter consisting essentially of a aliphatic poly-carboxylic acid having 3–6 carbon atoms.

2. The method of claim 1 wherein the poly-carboxylic acid is succinic acid.

3. The method of claim 1 wherein the poly-carboxylic acid is present at a level of 0.1 to 0.4% by weight, based on the total weight of the photopolymerizable composition.

4. The method of claim 1 wherein the binder is aqueous processible.

5. The method of claim 1 wherein the photopolymerizable composition comprises:

(a) 0.1–10% by weight photoinitiator system, based on the total weight of the photopolymerizable composition;

(b) 5–60% by weight ethylenically unsaturated compound, based on the total weight of the photopolymerizable composition;

(c) 25–90% by weight preformed macromolecular binder, based on the total weight of the photopolymerizable composition;

(d) 0.01–1.0% by weight adhesion promoter, based on the total weight of the photopolymerizable composition.

6. The method of claim 1 wherein the instant adhesion to copper, as measured by ASTM D 3359-78, Standard Method B, is such that no more than 50% of the photopolymerizable composition is removed by masking tape at 5 minutes after lamination.

7. The method of claim 6 wherein no more than 25% of the photopolymerizable composition is removed.

* * * * *

UNITED STATES PATENT AND TRADEMARK OFFICE
CERTIFICATE OF CORRECTION

PATENT NO.    : 6,297,294 B1    Page 1 of 1
DATED         : October 2, 2001
INVENTOR(S)   : Kenneth Isaac Lazaar It is certified that error appears in the above-identified patent and that said Letters Patent is hereby corrected as shown below:

<u>Column 2,</u>
Lines 37-38, after "malonic acid," insert -- succinic acid, --.

Signed and Sealed this

Twenty-sixth Day of March, 2002

Attest:

JAMES E. ROGAN
*Attesting Officer*          *Director of the United States Patent and Trademark Office*